United States Patent [19]

Gibson

[11] Patent Number: 4,701,676
[45] Date of Patent: Oct. 20, 1987

[54] TOUCH CONTROL ADAPTOR

[76] Inventor: John A. Gibson, 101 Kersey Crescent, Richmond Hill, Ontario, L4C 5X4, Canada

[21] Appl. No.: 941,988

[22] Filed: Dec. 15, 1986

Related U.S. Application Data

[63] Continuation-in-part of Ser. No. 810,217, Dec. 18, 1985, abandoned.

[51] Int. Cl.⁴ ...................... H01H 35/00; H05B 37/02
[52] U.S. Cl. ..................................... 315/362; 307/116
[58] Field of Search ................. 307/116; 315/362, 361

[56] References Cited

U.S. PATENT DOCUMENTS

| | | | |
|---|---|---|---|
| 3,886,376 | 5/1975 | Asija | 307/116 |
| 4,211,959 | 7/1980 | Deavenport et al. | 315/362 |
| 4,237,386 | 12/1980 | Instance | 307/116 |
| 4,490,625 | 12/1984 | Dilly | 315/362 |
| 4,584,519 | 4/1986 | Gruodis | 307/116 |

Primary Examiner—Harold Dixon
Attorney, Agent, or Firm—Ivor M. Hughes

[57] ABSTRACT

A device for connecting in series between a source of electric power and an appliance which, without modifying the normal power connections or other parts of the appliance, isolates the capacitance to ground characteristic of the appliance from the power supply and allows the flow of electrical power to the appliance to be regulated by a mere touch, usually by a human finger, to a surface of the appliance.

13 Claims, 6 Drawing Figures

TOUCH CONTROL ADAPTOR

FIELD OF THE INVENTION

This Application is a continuation-in-part application of U.S. patent application Ser. No. 810,217 filed the 18th day of Dec. 1985, now abandoned.

This invention relates to a device (and control circuitry therefor) for connecting in series between a source of electric power and an appliance which, without modifying the normal power connections or other parts of the appliance, isolates the capacitance to ground characteristic of the appliance from the power supply and allows the flow of electrical power to the appliance to be regulated by a mere touch, usually by a human finger, to a surface of the appliance. The device comprises an electrical power control circuit for regulating the supply of electrical power to an appliance in response to a change in the capacitance of the body of the appliance to ground between when the body of the appliance is touched and not touched. The function is accomplished by only making the normal electrical power connection and without altering the appliance or its insulation system in any way.

BACKGROUND OF THE INVENTION

Power control circuits for regulating the supply of electric power to an appliance in response to a person touching, or grounding the body of the appliance to ground, are known, wherein the body of the appliance is part of the power circuit. It is known to interpose impedance components between the normal power supply of the appliance and the body of the appliance in order to reduce the power supplied to the body of the appliance to a safe level. Physical connection with the power circuit via these impedance components is still necessary, however, in order for a person to regulate the power supplied to the appliance by touching the body of the appliance. Examples of power control circuits comprising physical connection with the power circuit may be seen in U.S. Pat. Nos. 3,919,596; 4,163,923; and 4,211,959.

It is therefore an object of this invention to provide a power control circuit for regulating the supply of power to an appliance in response to touch that is safer than such circuits heretofore, which have required physical connection with the power circuit.

It is a further object of this invention to provide a power control circuit for regulating the supply of power to an appliance in response to touch, wherein the impedance of its electrical conductors to the body of the appliance is the normal insulation system of the appliance, which is known to be safe.

It is a further object of this invention to provide a power control circuit for regulating the supply of power to an appliance in response to touch whereby the power control circuit may be safely connected to the appliance without altering or adapting the normal insulation and circuitry of the appliance.

Further and other objects of the invention will be apparent to those skilled in the art from the following Summary of the Invention and Description of a Preferred Embodiment of the Invention.

SUMMARY OF THE INVENTION

According to one aspect of the invention, a device is provided for being connected in series between a source of electric power and an appliance (for example, a lamp), comprising:

(I) a series electrical power circuit comprising (a) a beginning electrical connector, such as one side of a male plug, for making the connection to one side of an electrical power supply;

(b) an electrical power regulator, such as a triac, for increasing or decreasing the flow of power to the device;

(c) a first impedance circuit network, which may have a parallel connected inductive branch and capacitive branch, one side thereof connected to the electrical power regulator and the other side connected to a first appliance electrical connector, such as one side of a female receptacle;

(d) a second impedance circuit network which may have a parallel connected inductive branch and capacitive branch, one side of the second impedance circuit network (preferably identical to the first impedance circuit network), the first side thereof connected to a second appliance electrical connector such as the other side of the aforementioned female receptacle, the second side of the second impedance circuit being in turn connected to a last electrical connector, such as the other side of said male plug, for making the connection to the other side of the electrical power supply, and (II) an electronic sensing and power regulator control circuit comprising:

(a) a sensing circuit network, connected to the said appliance connectors, for providing an electrical signal, such as a voltage that is a measure of the capacitance to ground characteristic of a connected appliance, said sensing circuit network providing differences in the electrical signal (voltage) between when the surface of the appliance is touched by a human finger and when the appliance is not touched, the sensing circuit network in one embodiment being constructed using a phase locked loop integrated circuit and associated resistors and capacitors (b) an electrical signal processing network which takes the changes in the previously mentioned electrical signal and converts them into digital "1"'s and "0"'s, in one embodiment being constructed using, in series, an active filter and a rate operated comparator and (c) a memory and control circuit network which converts the digital output information of the electrical signal processing network into a control signal for the said electrical power regulator, in one embodiment such circuit comprising a series connection of a flip-flop and a triac gating optical isolator.

According to another aspect of the invention, a device is provided for connecting in series between a source of electrical power and only an appliance's power connection which regulates the supply of electrical power to the appliance in response to a mere touch of the appliance usually by a person's finger, said device comprising:

(a) an electrical connector for interposing the device between the current-carrying components of the appliance and the power supply;

(b) an electric power regulator for increasing or decreasing the electric power provided to said appliance;

(c) an electrical impedance network for electrically including the appliance within the impedance network when the device is connected between the source of electrical power and the appliance which impedance network means has a very low impedance to power supply frequencies and a high impedance to higher frequencies;

(d) an electronic sensing circuit for sensing the distributed capacitance to ground characteristic of the appliance as an electrical signal;

(e) an electronic signal processing network to condition the said electrical signal and;

(f) a memory and control circuit network to convert changes in said electrical signal into control signals for said electric power regulator.

According to another aspect of the invention, a module is provided for connecting in series by plugging into the domestic electricity supply and plugging a standard household portable lumiere (lamp) into the module which regulates the supply of electrical power to the lamp by a touch to the lamp, said module comprising:

(a) a first and second male blade for plugging into the electricity supply and a first and second female connector for receiving the male plug of the lamp which, in combination, form an electrical connector means for interposing the module between the lamp and the electrical power supply;

(b) a triac as an electrical power regulator means;

(c) a first and second impedance circuit network being the parallel connection of an inductor and a capacitor, said impedance circuit networks being arranged in series sequence of first impedance circuit network, first female connector for one side of lamp male plug, second female connector for other side of male lamp plug, second impedance circuit network in combination being the impedance network;

(d) a phase locked loop circuit network connected to the common point of said second female connector and second impedance circuit network, operating at a high frequency which maintains the said impedance network in a resonant mode thus having a first voltage level at a node in the network when the lamp is not touched and a second voltage level at said node when the lamp is touched;

(e) a voltage signal processing circuit which is a series connection of an active filter and a rate operated comparator to yield an output of digital "0" on said first voltage level and a digital "1" on said second voltage level;

(f) a memory and control circuit network means made up of a flip-flop with one output coupled to a triac gating optical isolator which is in turn operably connected to the triac enabling sequential "on" and "off" of the lamp with a series of touches to the lamp.

In one embodiment the said flip-flop is an integrated circuit and associated components that is responsive to both the fact of a digital "1" and its duration to provide a ramped dimming up or down of the lamp lighting level as well as "on" and "off" in response to touch of the lamp.

In another embodiment the said flip-flop is an integrated circuit and associated components that is responsive to digital "1"'s and "0"'s to provide a multi-step lighting level of say three or four steps in response to touches of the lamp.

According to another aspect of the invention an electrical device is provided for regulating the supply of power to a lamp having a normal insulation system wherein any conductive parts of the body of the lamp are electrically insulated from the components of the lamp carrying current from the power supply, by the normal insulating system of the lamp the device comprising:

(a) a male connector plug for connecting to power supply (for example, low frequency AC supply or DC power supply);

(b) at least a pair of parallel circuits having inductive branches and capacitive branches and a female plug receptacle to which the male plug elements of the lamp are received, the receptacle interposed in the pair of parallel circuits each having an inductive branch and capacitive branch thereby including the conductive parts of the body of the lamp when electrically connected to the device as part of the capacitive branch of the parallel circuits.

A power control circuit for regulating the supply of power to an appliance in response to a change in the impedance of the appliance to ground when the appliance is touched or grounded, and when in the untouched state, the device for being interposed between the current-carrying components of the appliance and a power supply, the device comprising an impedance network and electrical means for interposing the appliance within the network, the impedance network comprising at least a pair of parallel circuits each having an inductive branch and a capacitive branch whereby the capacitance to ground of the capacitive branch is increased by the capacitance to ground of a person touching the body of the appliance, the parallel resonant frequency of the network thereby changing, which provides a signal for regulating the supply of power to the appliance, the body of the appliance being insulated from the power supply by the normal insulation system of the appliance, thus providing a safer method of controlling the power to the device.

According to another aspect of the invention, a device is provided for regulating the supply of electrical power to an appliance comprising:

(a) electrical means for interposing the device between the current-carrying components of the appliance and the power supply;

(b) electrical means for locating the appliance within an impedance network when the device is interposed between the appliance and the power supply which has very low impedance to power supply frequencies and a high impedance to higher frequencies;

(c) electrical means for characterizing as an electrical signal the impedance of the appliance to ground without altering the normal insulation or assembly systems of the appliance;

(d) electrical means for sensing the change in impedance of the appliance to ground between when the appliance body is touched and the appliance body is not touched; and (e) means responsive to the sensed change in the impedance to ground of the appliance for increasing or decreasing the power supplied to the current carrying components of the appliance.

According to another aspect of the invention, a device is provided for regulating the supply of electrical power to a lamp having a normal insulation system which allows regulation when any of the conductive parts of the body of the lamp which are electrically insulated by the normal insulation system of the lamp from the components of the lamp carrying current from the power supply are touched or grounded, the device comprising:

(a) electrical means for interposing the device between the current-carrying components of the lamp and an electrical power supply;

(b) circuit means comprising at least a pair of parallel circuits having inductive branches and capacitive branches, and means for locating the lamp within the parallel circuits having the inductive branches and capacitive branches whereby the conductive parts of the body of the lamp become included as part of the capacitive branches of the said parallel circuits;

(c) circuit means which provides a source of a high frequency low power signal via the power conductors of the lamp to the body of the lamp located within the at least pair of parallel circuits whereby in the untouched state a resonant frequency is established and which circuit means characterizes the impedance to ground of the body of the lamp as an electrical signal (for example, a voltage);

(d) circuit means for sensing the change in the electrical signal (for example, voltage) which characterizes the change in the impedance to ground between when a conductive part of the body of the lamp is touched and a conductive part of the body of the lamp is not touched, as an electrical signal; and (e) circuit means for increasing or decreasing the power supplied to the current-carrying components of the lamp in response to a change to the electrical signal (for example, voltage) which characterizes the change in the impedance to ground.

An embodiment of the invention will now be illustrated with reference to the following drawings, which is adapted for touch activated regulation of the electrical power supplied to a household lamp. Schedule "A" following the Description of the Preferred Embodiment of the Invention lists the components identified by number in FIGS. 1, 2, 3, 4, 5, and 6 hereinafter referred to.

DETAILED DESCRIPTION OF A PREFERRED EMBODIMENT OF THE INVENTION

Figure 1:
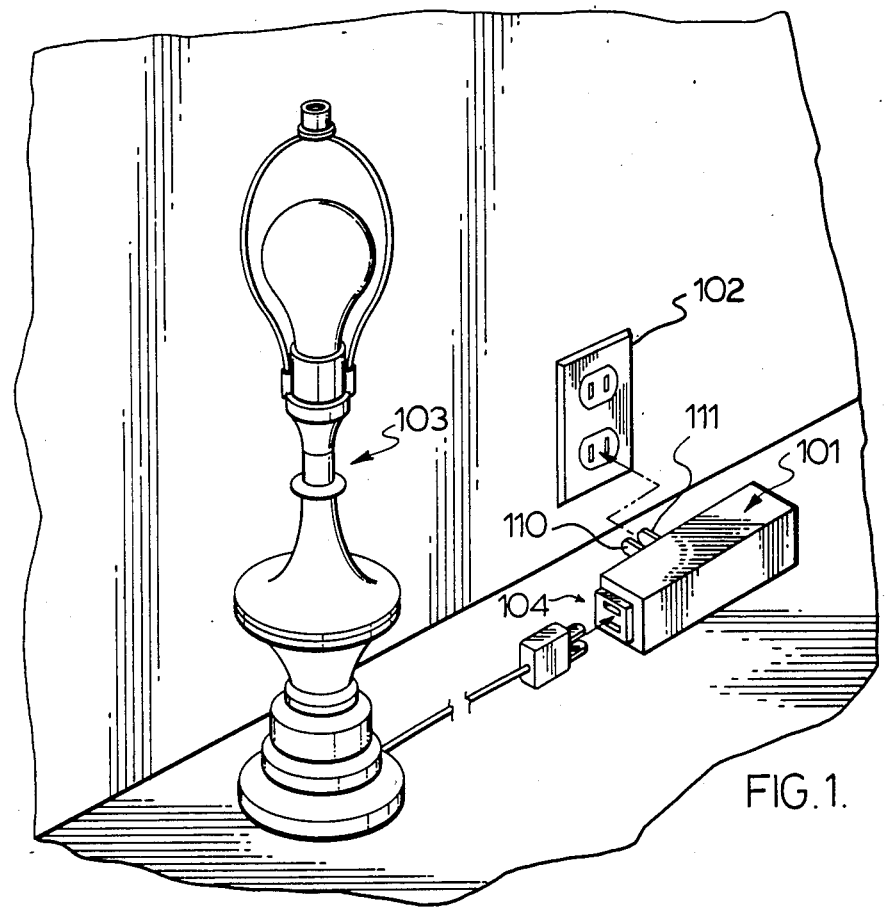
FIG. 1 is a pictorial view of a device (module) constructed according to a preferred embodiment of the invention being plugged into a wall outlet and a lamp being plugged into the module.
Figure 2:
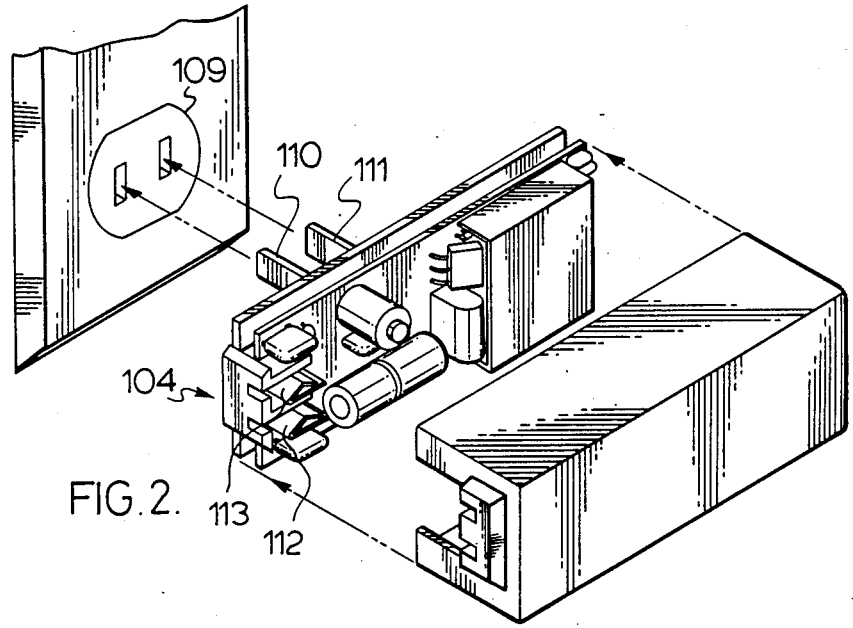
FIG. 2 is an exploded view of the device (module) in FIG. 1.

With reference to FIG. 1 there is shown device or module 101 constructed according to an embodiment of the invention, shown in its operating environment. In operation the male connectors 110 and 111 of device 101 are plugged into the wall receptacle 102 power supply and the lamp 103 is plugged into the female receptacle 104 of the module 101, thus making contact with the female connectors 112,113 contained therein. The arrangement of the female connectors 112,113 of module 101 is more clearly shown in the exploded view of FIG. 2.

A detailed circuit configuration of the embodiment of the invention contained within module 101 will now be described in conjunction with FIG. 3. The circuit consists of two principal parts; the first, a series connected electrical power circuit, which performs the functions of connecting to the power supply and to the lamp, regulating the power to the lamp and isolating the capacitance to ground characteristic of the lamp from the power supply; the second, an electronic sensing and memory/control circuit for the power regulator which performs the functions of sensing the capacitance to ground characteristic of the lamp as a voltage, converting change in this characteristic as a result of touching the lamp into digital signals and finally using the digital signals to activate a memory storage device whose output controls the power regulator in the power circuit.

The power circuit is connected via male blade 110 to one side of the power supply 1 which is the domestic electricity supply at 120 volts 60 Hertz. This supply, by its nature, will have a distributed capacitance 12 to ground of several thousand picofarads and may in fact be grounded at one side 13. In series with blade 110 is a triac 4 bypassed by parallel capacitor 11 of 10,000 picofarads. Connected in series with the triac 4 is one side of a first impedance circuit network made up of inductor 7 of 250 microhenries and capacitor 8 of 500 picofarads, connected in parallel. The other side of said first impedance circuit network is connected to a first female connector 113, then in series the lamp 3, and a second female connector 112. Connector 112 connects to one side of a second impedance circuit network consisting of inductor 5 of 250 microhenries and capacitor 6 of 500 picofarads connected in parallel the second side of which is connected to a second male blade 111 and thence to the other side of the power supply 1. The first and second impedance circuit networks make up electrical impedance network 2, which includes the lamp 3 along with its distributed capacitance to ground shown as capacitor 14 (typical values approximately 30 to 90 picofarads). The inductors 5 and 7 are made with wire able to carry the full load current of the lamp, typically #20 AWG for a 300 Watt lamp bulb.

The electronic sensing circuit begins with the phase locked loop network consisting of phase locked loop 10 and its associated capacitors 17, 18, 19 and resistors 20, 21, 22, 23, 24 that operate to present a frequency at node 9 which will be the particular resonant frequency of the impedance network 2/lamp capacitance 14 combination, typically about 450 kilohertz for the values of the circuit devices chosen. (A more complete explanation of the operation of the phase locked loop portion of the circuit is presented in conjunction with FIG. 4 hereafter). By the operation of the phase locked loop network, the voltage at node 16 is a direct linear function of the frequency at node 9. A normal value is about 10 volts at node 16 for 450 kilohertz at node 9. When a person's body capacitance of approximately 50 to 300 picofarads is brought into contact with a surface 15 of the lamp, by touching the lamp, this increases the value of capacitor 14. This increased value of capacitor 14 means the resonant frequency presented at node 9 by the phase locked loop network is decreased and the voltage at node 16 is decreased, typically by 0.2 to 0.4 volts. Similarly, when the touch is removed, the voltage at node 16 goes back to the previous higher level.

The capacitor 11 is a high frequency bypass capacitor provided to enable operation of the sensing circuit in the event that the electrical power supply is reversed.

The changes in voltage at node 16 are processed by operational amplifiers 29 and 38 and their associated capacitors and resistors to yield a digital "1" at node 40 when node 16 voltage is moved lower (lamp touched) and a digital "0" at node 40 when node 16 voltage is high (lamp untouched).

The processing is done in two stages. The first stage through operational amplifier 29 and its associated capacitors 27,28, resistors 25,26 form a low pass active filter to attenuate electronic noise at node 16 and the second stage through operational amplifier 38 and its associated capacitor 30 and resistors 31, 32, 33, 34, 35, 36, 37 which form a rate activated comparator with noise suppressing hysterisis such that when a change of level at node 39 of more than about 0.1 volts happens with a fall or rise rate of more than about 2 volts per second, operational amplifier 38 changes the signal at node 40 as described above. The signal at node 40 is connected to flip-flop 41. Flip-flop 41, such as one-half a type 4013 flip-flop will put node 42 alternately at "1" or "0" for each "1" appearing at node 40. This signal at 42 is fed via resistor 43 to the light-emitting diode of triac gating optical isolator 44. When the light-emitting diode is energized by a digital "0" at node 42, its light triggers on the triac of 44 which in turn provides gate power via resistor 45 to triac 4, thus turning on the lamp 3. If a digital "1" is at node 42, no power is provided to the optical isolator and the lamp 3 remains off.

A power supply 46 furnishes low voltage, low power direct current as required to operate the electronic devices.

The effect of this embodiment is to alternately turn the lamp on and off at each time a metal part of the body of the lamp is touched.

Figure 4:
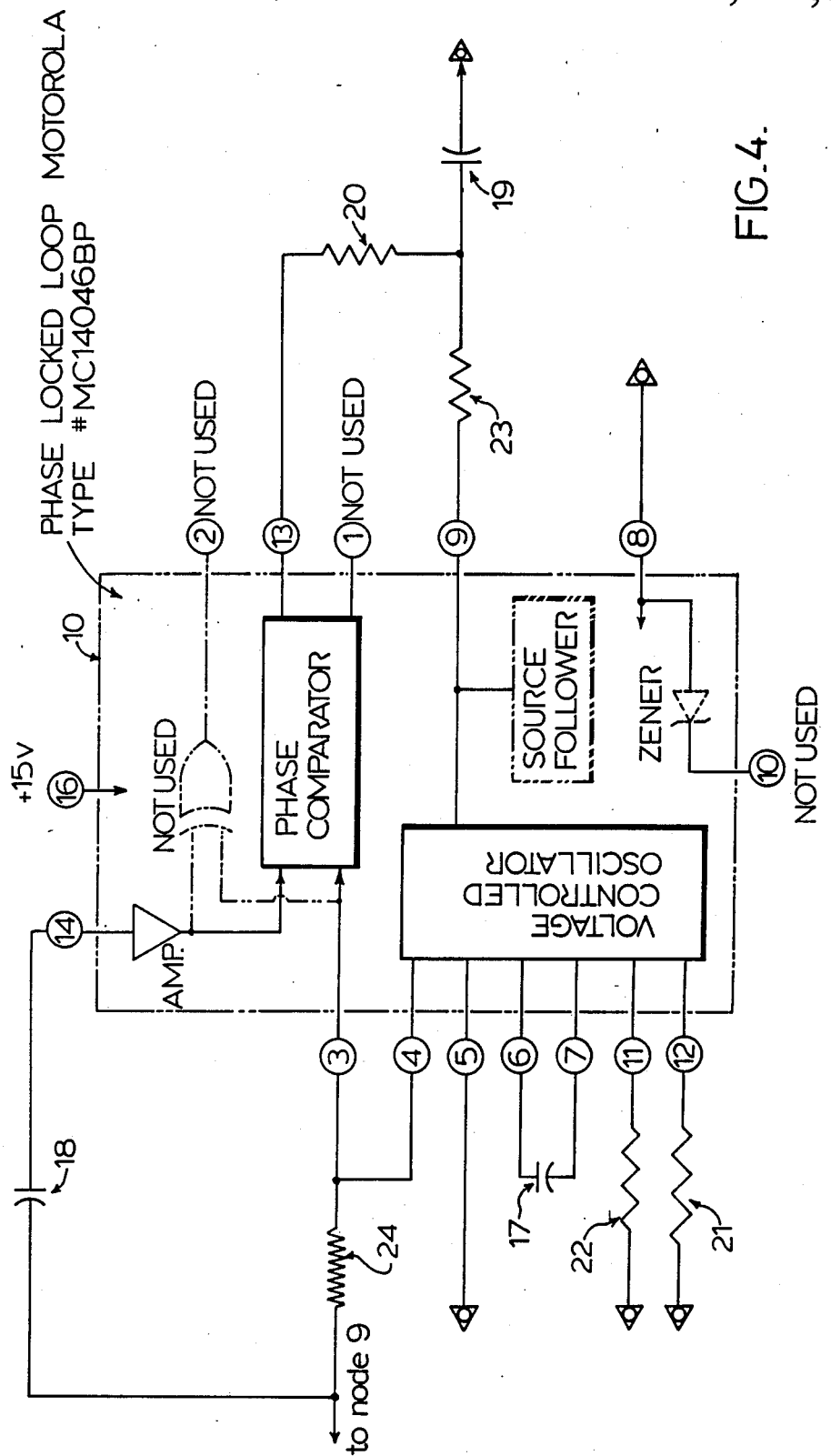
FIG. 4 is a detail electrical block diagram of the phase locked loop and its associated components forming part of the electrical circuit of the device shown in FIGS. 1 and 2.

Referring now to FIG. 4, an explanation of the operation of the phase locked loop network is presented.

A block diagram of a phase locked loop integrated circuit 10 as manufactured by Motorola Semiconductors and others as type 4046 is shown. The device consists of two main parts, a voltage controlled oscillator (VCO) and a phase comparator (A second phase comparator, a source follower and a zener regulator included in this integrated circuit are not used and have only been shown dotted for completeness.)

The VCO circuit is connected through pins 4, 5, 6, 7, 9, 11, and 12. When a capacitor 17 of 50 picofarads is connected to pins 6, 7, resistors 21 and 22 of 120 kilohms each are connected to pins 11, 12, and pin 15 is connected to 0V as shown then a square wave output of 0V to +15 V, of frequency range of approximately 350 to 500 kilohertz will appear at pin 4 as direct linear function of the voltage at pin 9 in the range 0 V to +15 V.

The phase comparator is connected through input pins 3 and 14 and output pin 13. This circuit compares the frequency and phase relationship between the leading edge of an input signal at pin 14 with the leading edge of a reference input signal at pin 3 to produce an output at pin 13. The output at pin 13 is continually high (+15 V) if the frequency at pin 14 is higher than the reference signal frequency at pin 3. Similarly, the output at pin 14 is continually low (0 V) if the frequency at pin 14 is lower than the reference input at pin 3. If the frequencies at pin 14 and pin 3 are identical, then the output at pin 13 is a pulse at the input frequency whose width is proportional to the phase difference between the leading edges of the two input signals. This pulse is positive going if the phase of the signal at pin 14 is lagging the signal at pin 3 and the pulse is negative going if the signal at pin 14 is leading the signal at pin 3. The amount of phase difference between the inputs to range the output from a virtual full positive pulse (+15 V) to a virtual full negative (0 V) pulse is about one degree.

Using these two portions of the integrated circuit 10 and connecting them together as shown in FIG. 4; output pin 4 of VCO directly connected to phase comparator input pin 3; output pin 4 connected via resistor 24 to node 9 of impedance network 2 (lamp combination made up of parallel capacitive and inductive branches); node 9 connected via capacitor 18 to input pin 14; output pin 13 connected to node 16 by resistor 20; node 16 connected via capacitor 19 to 0 V of the power supply and via resistor 23 to input 9 of the VCO; results in a closed loop feedback circuit network.

This circuit functions as follows: when initially powered, the voltage at node 16 is at 0 V, thus the output frequency at pin 4 is at the minimum of 350 kilohertz as described above and the impedance network 2 lamp combination will be below resonance; this below resonance means that the phase of the signal at node 9 will be lagging that of the VCO; as network 2 is separated from the VCO output (pin 4) by resistor 24; since VCO output 4 is connected directly to phase comparator input pin 3 and node 9 is connected via capacitor 18 to phase comparator input pin 14, the output, at pin 13, is virtually +15 V and capacitor 19 (0.22 microfarads approx.) is charged via resistor 20 (470 kilohms approx.); by this charging, node 16 increases in voltage which in turn increases the output frequency of the VCO; at some specific frequency, say 450 kilohertz, the impedance network 2/lamp combination will move towards resonance meaning that the signal at node 9 will move towards being in phase with the signal of the VCO and thus the phase comparator output will start to proportion the width of its output pulse; by the integrating action of the resistor 20/capacitor 19 combination exactly the correct amount of voltage is maintained at node 16 to keep these input signals to the phase comparator in phase; if the frequency of the VCO is too high for resonance, as when the added capacitance of a person touching the lamp is included, then the signal phase at node 9 leads the VCO and output 13 of goes to 0 V, discharging capacitor 19 until a correct lower voltage at node 16 keeps the impedance network 2/touched-lamp combination in resonance. These actions take approximately two to five milliseconds to be complete. In this manner the voltage at node 16 provides a signal which indicates whether the lamp is not touched or touched.

Figure 3:
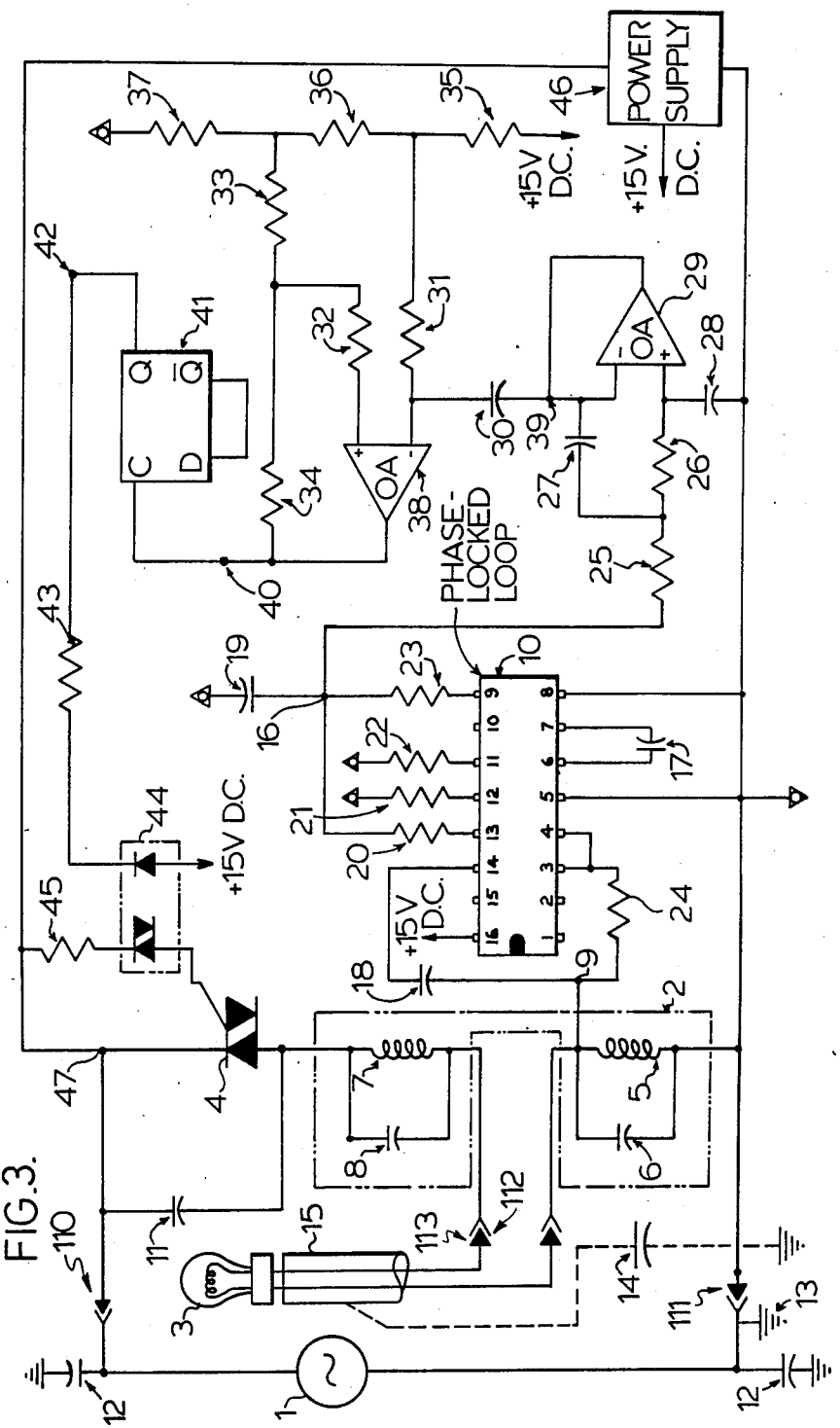
FIG. 3 is a drawing of the electrical circuit of the preferred embodiment of the invention shown in FIGS. 1 and 2 including connection to a power supply and a lamp.
Figure 5:
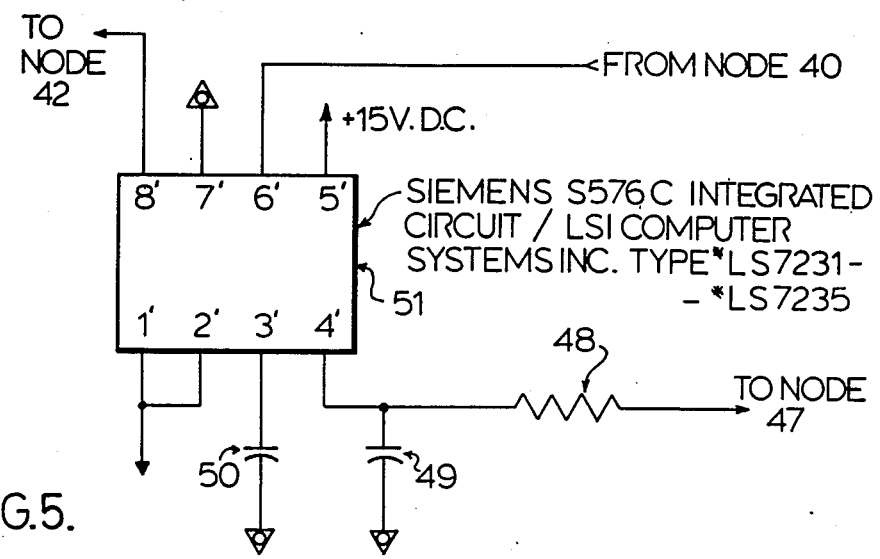
FIG. 5 is an electrical schematic diagram of a circuit which may be used to replace a portion of the circuit shown in FIG. 3, thereby providing a full range of "on", "off" and intermediate dimming control.
Figure 6:
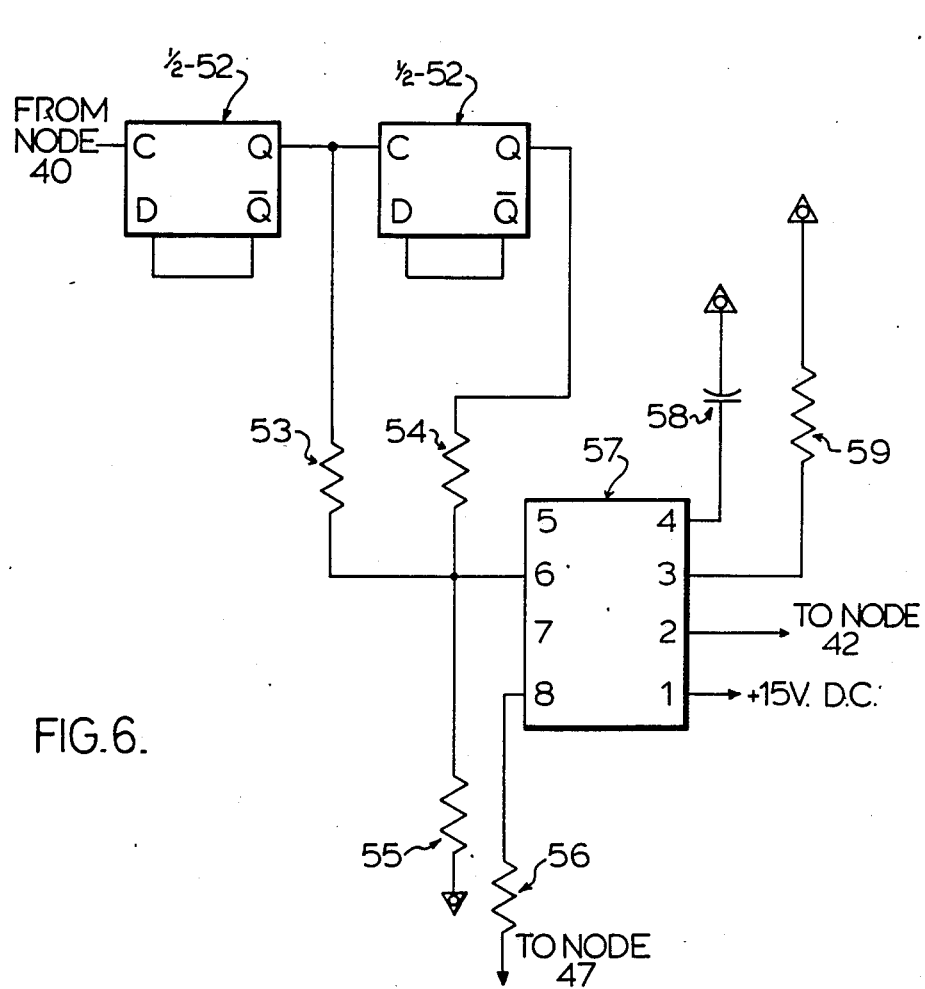
FIG. 6 is an electrical schematic diagram of a circuit which may be used to replace a portion of the circuit of FIG. 3, thereby providing a "tri-light" control action.

By removing the existing network of FIG. 3 between nodes 40 and 42 and interposing between nodes 40 and 42 various networks or devices that respond to number, sequence, frequency, duration or combination thereof of the digital "1"'s and "0"'s that appear at node 40 as a result of touches, a variety of switching, dimming, control and timing sequences of the lamp are easily achieved and contemplated for the use of the invention in a preferred embodiment. For example, by replacing flip-flop 41 by integrated circuit chip S576 as manufactured by Siemens Components Inc. and making the necessary connections as shown in FIG. 5, the full range of "on", "off" and dimming described for the S576 may be utilized. A second example of replacing flip-flop 41 with the network shown in FIG. 6 would result in a "tri-light" action wherein the lamp would come on dimly at the first touch, more brightly at the second touch, brightest at the third touch and off again at the forth touch.

Other means of characterizing the impedance of the lamp to ground may be used without departing from the embodiment of the invention, as for example utilizing at node 9 circuits other than a phase locked loop, such as a charge pumping circuit; pulse response circuit; and an oscillator circuit triggered on or off.

As many changes can be made to the embodiment of the invention without departing from the scope of the invention, it is intended that all material be considered as illustrative of the invention and not in a limiting sense.

The embodiments of the invention in which an exlusive property or privilege is claimed are as follows:

1. A device for connecting in series between a source of electrical power and only an appliance's power connection which regulates the supply of electrical power to the appliance in response to a mere touch of the appliance, said device comprising;
   (a) an electrical connector for interposing the device between the current-carrying components of the appliance and the power supply;
   (b) an electric power regulator for increasing or decreasing the electric power provided to said appliance;
   (c) an electrical impedance network for electrically including the appliance within the impedance network when the device is connected between the source of electrical power and the appliance which impedance network has a very low impedance to power supply frequencies and a high impedance to frequencies higher than power supply frequencies;
   (d) an electronic sensing circuit for sensing the distributed capacitance to ground characteristic of the appliance as an electrical signal;
   (e) an electronic signal processing network to condition the said electrical signal; and
   (f) a memory and control circuit network to convert changes in said electrical signal into control signals for said electric power regulator.

2. A module for connecting in series by plugging into the domestic electricity supply and plugging a standard household portable lumiere (lamp) into the module which regulates the supply of electrical power to the lamp by a touch to the lamp, said module comprising:
   (a) a first and second male blade for plugging into the electricity supply and a first and second female connector for receiving the male plug of the lamp which, in combination, form an electrical connector means for interposing the module between the lamp and the electrical power supply;
   (b) a triac as an electrical power regulator means;
   (c) a first and second impedance circuit network being the parallel connection of an inductor and a capacitor, said impedance circuit networks being arranged in series sequence of first impedance circuit network, first female connector for one side of lamp male plug, second female connector for other side of male lamp plug, second impedance circuit network in combination being the impedance network;
   (d) a phase locked loop circuit network connected to the common point of said second female connector and second impedance circuit network, operating at a high frequency which maintains the said impedance network in a resonant mode thus having a first voltage level at a node in the network when the lamp is not touched and a second voltage level at said node when the lamp is touched;
   (e) a voltage signal processing circuit which is a series connection of an active filter and a rate operated comparator to yield an output of digital "0" on said first voltage level and a digital "1" on said second voltage level said output being connected to;
   (f) a memory and control circuit network means made up of a flip-flop with one output coupled to a triac gating optical isolator which is in turn operably connected to the triac enabling sequential "on" and "off" of the lamp with a series of touches to the lamp.

3. A module according to claim 2, wherein the said flip-flop is an integrated circuit and associated components which circuit is responsive to both the fact of a digital "1" and its duration to provide a ramped dimming up or down of the lamp lighting level as well as "on" and "off" in response to touch of the lamp.

4. A module according to claim 2, wherein the said flip-flop is an integrated circuit and associated components which circuit is responsive to digital "1"'s to provide a multi-step lighting level of say three or four steps in response to touches of the lamp.

5. A device for regulating the supply of electrical power to an appliance which is plugged into it electrically connected in response to a mere touch (usually by a person's finger) comprising:
   (a) electrical means for interposing the device between the current-carrying components of the appliance and the power supply;
   (b) electrical means for connecting the appliance within an impedance network when the device is interposed between the appliance and the power supply which has very low impedance to power supply frequencies and a high impedance to higher frequencies;
   (c) electrical means for characterizing as an electrical signal the impedance of the appliance to ground without altering the normal insulation or assembly systems of the appliance;
   (d) electrical means for sensing the change in impedance of the appliance to ground between when the appliance body is touched and the appliance body is not touched; and,
   (e) electrical means responsive to the sensed change in the impedance to ground of the appliance for increasing or decreasing the power supplied to the current carrying components of the appliance.

6. A device for regulating the supply of electrical power to a lamp having a normal insulation system which allows regulation when any of the conductive parts of the body of the lamp which are electrically insulated by the normal insulation system of the lamp; from the components of the lamp carrying current from the power supply is touched or grounded the device comprising:
   (a) electrical means for interposing the device between the current-carrying components of the lamp and a power supply;
   (b) circuit means comprising parallel circuits having inductive branches and capacitive branches and means for electrically locating the lamp within the parallel circuits having the inductive branches and capacitive branches whereby the conductive parts of the body of the lamp become included as part of the capacitive branch of the said parallel circuits;

(c) circuit means which provides a source of a high frequency low power signal via the power conductors of the lamp to the body of the lamp located within the parallel circuits whereby in the untouched state a resonant frequency is established and which circuit means characterizes the impedance to ground of the body of the lamp as an electrical signal;

(d) circuit means for sensing the change in the electrical signal which characterizes the change in the impedance to ground between when a conductive part of the body of the lamp is touched and a conductive part of the body of the lamp is not touched, as an electrical signal;

(e) circuit means for increasing or decreasing the power supplied to the current-carrying components of the lamp in response to a change to the electrical signal which characterizes the change in the impedance to ground.

7. The device of claim 6, wherein the circuit means characterizing the impedance to ground of the body of the lamp as an electrical signal, characterizes the impedance as a voltage.

8. A device for being connected in series between a source of electric power and an appliance comprising:

(I) a series electrical power circuit comprising:

(a) a beginning electrical connector, such as one side of a male plug for making the connection to one side of an electrical power supply;

(b) an electrical power regulator for increasing or decreasing the flow of power;

(c) a first impedance circuit network, one side thereof connected to the electrical power regulator and the other side connected to a first appliance electrical connector;

(d) a second impedance circuit network, the first side thereof connected to a second appliance electrical connector, the second side of the second impedance circuit being in turn connected to a last electrical connector for making the connection to the other side of the electrical power supply; and (II) an electronic sensing and power regulator control circuit comprising:

(a) a sensing circuit network, connected to the said appliance connectors, for providing an electrical signal, such as a voltage, that is a measure of the capacitance to ground characteristic of a connected appliance, said sensing circuit network providing differences in the electrical signal between when the surface of the appliance is touched by a human finger and when the appliance is not touched;

(b) an electrical signal processing network which takes the changes in the previously mentioned electrical signal and converts them into digital "1"'s and "0"'s;

(c) a memory and control circuit network which converts the digital output information of the electrical signal processing network into a control signal for the said electrical power regulator.

9. The device of claim 8, wherein the first and second impedance circuit network each comprises a parallel connected inductive branch and capacitive branch.

10. The device of claim 8, wherein the sensing circuit network is constructed using a phase locked loop integrated circuit and associated resistors and capacitors.

11. The device of claim 8, wherein the electrical signal processing network is constructed using, in series, an active filter and a rate operated comparator and the memory and control circuit network comprises a series connection of a flip-flop and a triac gating optical isolator.

12. A device for regulating the supply of power to a lamp having a normal insulation system wherein any conductive parts of the body of the lamp are electrically insulated from the components of the lamp carrying current from the power supply by the normal insulating system of the lamp, the device comprising:

(a) a male connector plug for connecting to a power supply;

(b) at least a pair of parallel circuits having inductive branches and capacitive branches and a female plug receptacle to which the male plug elements of the lamp are received, the receptacle interposed in the parallel circuits each having an inductive branch and capacitive branch thereby including the capacitance of the conductive parts of the body of the lamp when electrically connected to the device as part of the capacitive branch of the parallel circuits.

13. A device for electrically connecting between a power supply and an appliance, without modifying the normal power connecting means or other parts of the appliance, which device isolates the capacitance to ground characteristic of the appliance from the power supply and allows the electrical power to the appliance to be regulated by a mere touch, usually a human finger, to a surface of the appliance, the devise comprising a power control circuit for regulating the supply of power to the appliance in response to a change in the impedance of the appliance to ground when the appliance is touched or grounded, and when in the untouched state, the device for being interposed between the current-carrying components of an appliance and a power supply, the device further comprising a connector for interposing the appliance within an impedance network, the impedance network comprising at least a pair of parallel circuits each having an inductive branch and a capacitive branch whereby the capacitance to ground of the capacitive branch is increased by the capacitance to ground of a person touching the body of the appliance, the parallel resonant frequency of the network thereby changing, which provides a signal for regulating the supply of power to the appliance.

* * * * *